United States Patent
Miyatake

(10) Patent No.: US 10,714,153 B2
(45) Date of Patent: *Jul. 14, 2020

(54) REVERSED BIAS COMPENSATION FOR SENSE AMPLIFIER OPERATION

(71) Applicant: Micron Technology, Inc., Boise, ID (US)

(72) Inventor: Shinichi Miyatake, Sagamihara (JP)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/659,197

(22) Filed: Oct. 21, 2019

(65) Prior Publication Data

US 2020/0098402 A1    Mar. 26, 2020

Related U.S. Application Data

(63) Continuation of application No. 16/137,175, filed on Sep. 20, 2018, now Pat. No. 10,482,931.

(51) Int. Cl.
| | |
|---|---|
| *G11C 7/00* | (2006.01) |
| *G11C 11/4091* | (2006.01) |
| *G11C 11/4096* | (2006.01) |
| *G11C 11/4094* | (2006.01) |
| *G11C 7/06* | (2006.01) |

(52) U.S. Cl.
CPC ............ *G11C 7/00* (2013.01); *G11C 11/4091* (2013.01); *G11C 11/4094* (2013.01); *G11C 11/4096* (2013.01); *G11C 7/06* (2013.01)

(58) Field of Classification Search
CPC ......... G11C 7/00; G11C 7/06; G11C 11/4094; G11C 11/4096
See application file for complete search history.

(56) References Cited

U.S. PATENT DOCUMENTS

| | | |
|---|---|---|
| 9,202,531 B2 | 12/2015 | Seo |
| 9,773,544 B2 | 9/2017 | Woo et al. |
| 2010/0226192 A1 | 9/2010 | Moon et al. |
| 2010/0277997 A1 | 11/2010 | Kim et al. |

*Primary Examiner* — Ajay Ojha
(74) *Attorney, Agent, or Firm* — Fletcher Yoder, P.C.

(57) ABSTRACT

Memory devices may employ flip-flops with paired transistors in sense amplifying circuitry to sense charges stored in memory cells. Paired transistors may present mismatches in electrical characteristics, which may affect the sensitivity of the sense amplifying circuitry. Embodiments include systems and methods that compensate and/or mitigate mismatches in the electrical characteristics of the paired transistors. To that end, the memory devices may sense the mismatches during a compensation period and pre-compensate the read-out of data lines to improve the sensibility of the sense amplifying circuitry.

22 Claims, 11 Drawing Sheets

REVERSED BIAS COMPENSATION FOR SENSE AMPLIFIER OPERATION

CROSS REFERENCE TO RELATED APPLICATIONS

This application is a continuation of U.S. patent application Ser. No. 16/137,175, entitled "REVERSED BIAS COMPENSATION FOR SENSE AMPLIFIER OPERATION," filed Sep. 20, 2018, which is hereby incorporated by reference in its entirety for all purposes.

BACKGROUND

Field of the Present Disclosure

This disclosure relates to memory devices, and more specifically, to sense amplifier circuitry.

Description of Related Art

Memory devices, such as random access memory (RAM) devices, dynamic RAM devices (DRAMs), static RAM devices (SRAMs), or flash memories, are often used in electronic systems to provide memory functionality to facilitate data processing operations and/or facilitate data storage during data processing operations. To that end, these memory devices may have addressable memory elements arranged in memory arrays and/or banks. These memory devices may also include an input/output (I/O) interface that provides data access between memory elements and processing circuitry (e.g., a processor, a microcontroller, a system-on-chip). The I/O interface of the memory device may be coupled to the memory elements through an internal data path that may include circuitry for reading or writing data bits in the memory elements.

The memory elements may include a component, such as capacitor, that may store a charge associated with a bit stored in the memory cell. In order to read the charge in the memory cell component, the component may be coupled to circuitry that can detect the charge stored. Sense amplify (SA) circuitry, for example, may be coupled to the memory device to read the stored charge. In some systems, the SA circuitry may include flip-flop circuitry that may include paired components, such as transistors. Mismatches between electrical properties of the paired components may negatively impact the sensitivity of the SA circuitry to the charge in the memory cell component. As the dimensions of memory elements and the SA circuitry decreases, and as speed and power specification for memories devices become more restrictive, improvements in the sensitivity and power consumption of SA circuitry may allow evolution in the performance of memory devices.

BRIEF DESCRIPTION OF THE DRAWINGS

Various aspects of this disclosure may be better understood upon reading the following detailed description and upon reference to the drawings in which.

DETAILED DESCRIPTION

Figure 1:
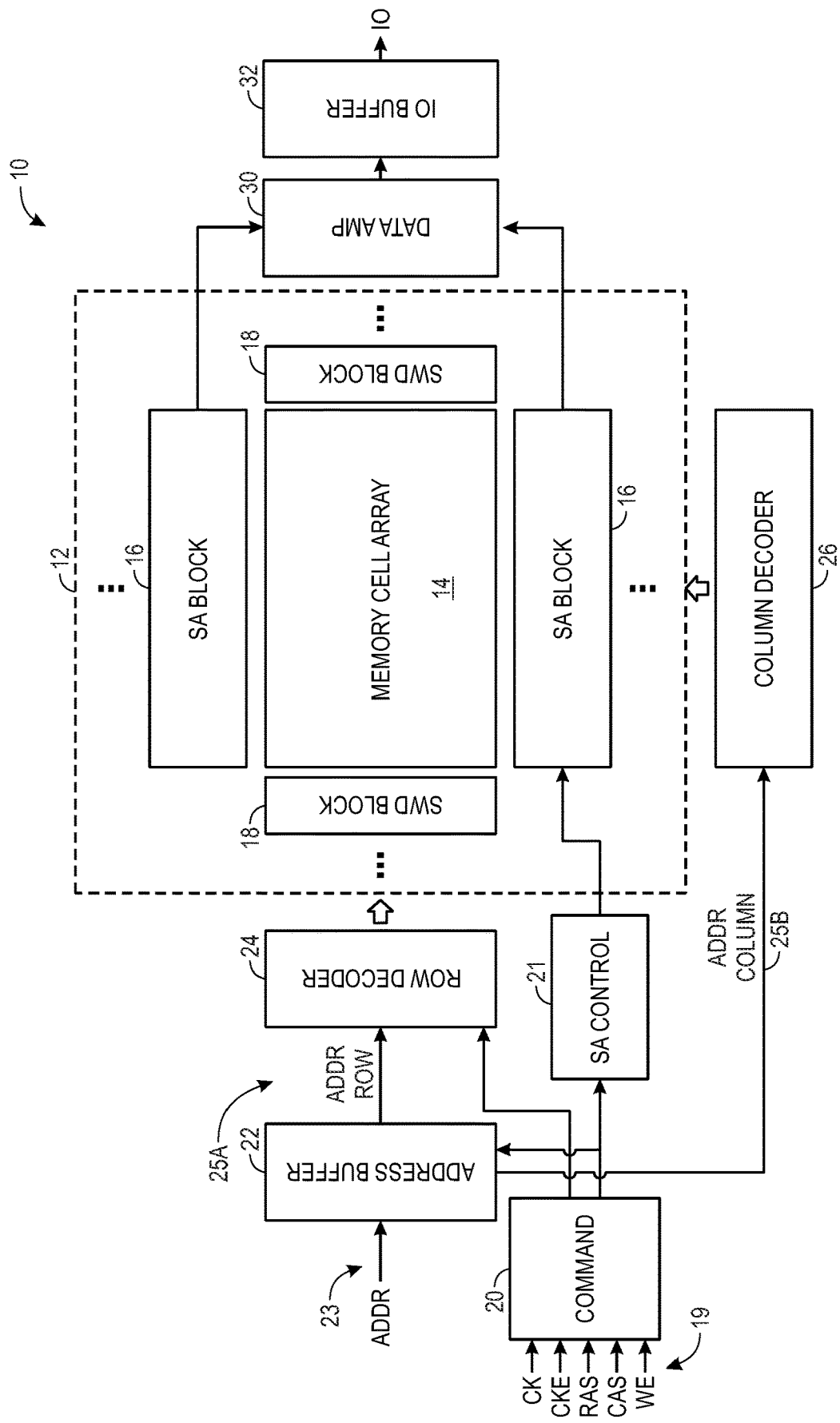
FIG. 1 is a block diagram of a memory device, in accordance with an embodiment.

One or more specific embodiments will be described below. In an effort to provide a concise description of these embodiments, not all features of an actual implementation are described in the specification. It may be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it may be appreciated that such a development effort might be complex and time consuming, but would nevertheless be a routine undertaking of design, fabrication, and manufacture for those of ordinary skill having the benefit of this disclosure.

Many electronic systems may employ memory devices to provide data storage functionalities and/or facilitate the performance of data processing operations. Several memory devices may store data using addressable memory elements (e.g., memory cells), which may be disposed in memory banks. Examples of addressable memory devices include random access memories (RAMs) devices, dynamic RAM (DRAMs) devices, static RAM (SRAMs) devices, and/or flash memory devices, among others. Processing circuitry in the electronic systems may access (e.g., read/write) the memory elements by interacting with an input/output (I/O) interface and a command interface. As an example, a processor may read stored information from a particular memory element from the memory device by providing a read command and/or an address via the command interface, and retrieve the requested information (e.g., data bits) via the I/O interface.

The memory elements may store the data bits in a component that can store a charge, such as a capacitor. For example, during a write process, a capacitor of a memory element may be configured to store a first voltage (e.g., 1V, 0.5V) associated with a first bit (e.g., TRUE) or a second voltage (e.g., 0V, −1V, −0.5V) associated with a second bit (e.g., FALSE). In order to read the stored voltage, the memory device may employ circuitry capable of sensing. For example, certain devices may employ a sense amplifier (SA) circuit that is capable of sensing the charge in the memory element and latching the sensed charge in a data line. In some embodiments of memory devices, the SA circuit may include a flip-flop circuit that may be formed with N-type and/or P-type metal-oxide semiconductor field electric transistors (MOSFETs). The N-type MOSFET transistors (referred to herein as NMOS transistors) and the P-type MOSFET transistors (referred to herein as PMOS transistors) may be arranged in pairs (i.e., pairs of NMOS transistors and/or pairs of PMOS transistors) within the flip-flop to sense the difference between data-line pairs that may be coupled to the memory cell. However, MOSFET transistors may present different electrical characteristics (e.g., gate-source threshold voltage (Vth)), which may affect the sensitivity of the flip-flop based sensing.

As an example, in certain SA circuits, the NMOS transistors may have a larger ON current in comparison with the PMOS transistors, and as a result, the NMOS transistors may dominate the sensing operation and affect the readout of the minute signals from the charge storage element. As such, variations in the Vth of the NMOS transistors may decrease sensitivity margins of the SA circuit. The decreased sensitivity margins may be conventionally compensated by increasing the power requirements of the memory device (e.g., more frequent refresh operations, increase power stored in memory cells, etc.). Moreover, miniaturization of the memory cells, which may lead to reduction in the capacitance of the memory cell components and reduction of the gate lengths may further increase the challenges associated with variations in the Vth or other electrical properties. Embodiments described herein may mitigate electrical property mismatches and improve sensitivity margins by employing a reversed bias compensation of electrical property mismatches. The embodiments may employ biasing circuitry and power source selection circuitry that may operate with pre-charge circuits in the SA system, to improve the charge sensitivity in the memory devices.

With the foregoing in mind, FIG. 1 is a block diagram of a DRAM device 10 in accordance with an embodiment of the present invention. The DRAM device may have memory banks 12, which may include one or more memory cell arrays 14. Each memory cell array 14 may be coupled to one or more sense amplifier (SA) blocks 16. The SA blocks 16 may include SA circuits that may facilitate read and/or write operations, such as the ones described in detail herein. The memory cell array 14 may also be coupled to subword driver (SWD) blocks 18. The SWD blocks 18 may facilitate read and write operations by providing voltages that may activate rows or columns of memory cells in the memory cell array 14.

Memory banks 12 may be controlled by clock and/or command signals 19, which may be received by a command block 20. Command block 20 may decode the clock and/or command signals 19 to generate various inner control signals to control internal circuitry, such as address buffers 22, decoders such as row decoder 24 and column decoder 26, SA control block 21, data amplifier 30, and input/output (I/O) buffer 32. For example, based on the clock and/or command signals 19, the command block 20 may provide commands to an SA control block 21. The SA control block 21 may provide commands to the SA blocks 16, including pre-charge commands, writing commands, reading commands, and other commands detailed below. The address buffer 22 may receive address signal 23. The clock and/or command signals 19 and the address signal 23 may be provided by processing circuitry coupled to the memory device, as discussed above.

The address signal 23 may be received by in the address buffer 22 as a row address 25A and a column address 25B. The row address 25A may be provided to a row decoder 24 and the column address 25B may be provided to a column decoder 26. The row decoder 24 and the column decoder 26 may be used to control the appropriate SWD block 18 and SA block 16, respectively, to activate the memory cells associated with the requested address signal 23. For example, in a read operation, the memory cells associated with the row address 25A and the column address 25B may be activated by a SWD block 18 to generate read data signal through the SA block 16, and data amplifier 30 and I/O buffer 32 may amplify and transport the read data to an external device.

Figure 2:
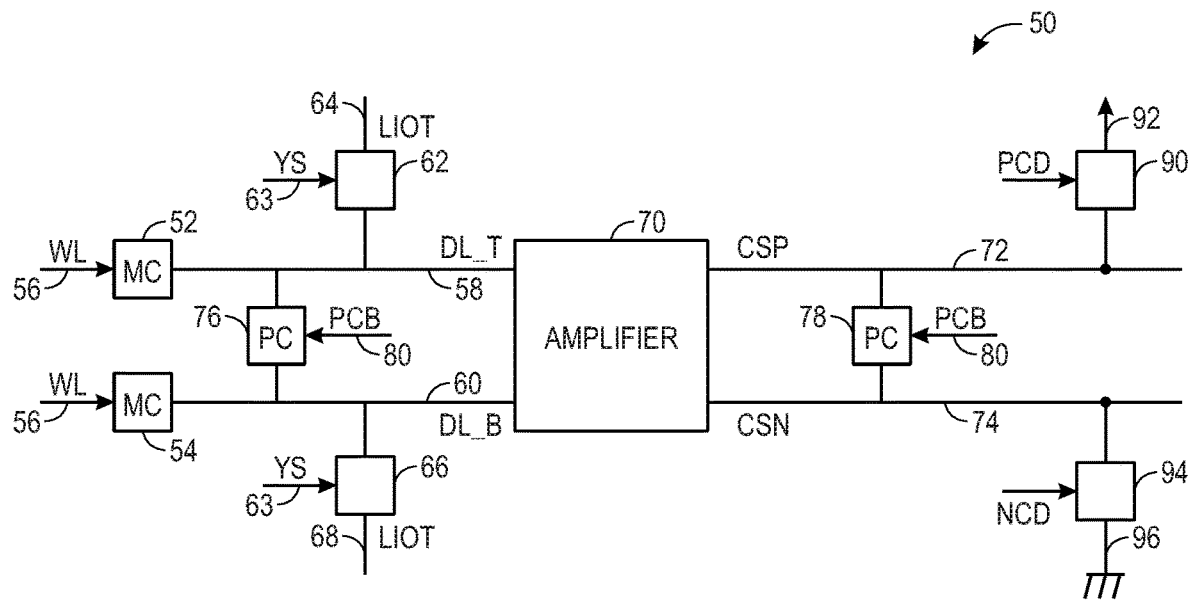
FIG. 2 is a block diagram of memory cells and of a sense amplifier (SA) circuit that may include compensation circuitry, in accordance with an embodiment.

FIG. 2 illustrates a block diagram of an SA system 50, which may implement a reversed bias compensation, as discussed herein. The block diagram of FIG. 2 is provided to illustrate general functionality of the SA system, and detailed embodiments of the SA systems are discussed below in FIGS. 4, 7, 8, and 9. The SA system 50 may be connected to memory cells 52 and 54, which may store charges associated with memories. In some embodiments, memory cells 52 and 54 may store complementary bits. Memory cells 52 and 54 may be controlled by world line (WL) signals 56. When activated by a WL signal, the memory cells 52 and 54 may couple to data line (or digit line) pairs DL_T 58 and DL_B 60 for read and/or write operations.

The pair of digit lines DL_T 58 and DL_B 60 may be coupled to local I/O lines LIOT 64 and LIOB 68 through switches 62 and 66, which may be controlled by a YS signal 63. The local I/O lines LIOT 64 and LIOB 68 may be connected to I/O buffers (e.g., data amplifier 30 and/or I/O buffer 32 illustrated in FIG. 1) to exchange data with external devices. For example, a write operation may proceed by charging the local I/O lines LIOT 64 and LIOB 68 with voltages based on the data to be written to the memory cells 52 and 54, respectively, activating the YS signals 63 to charge the data line pair DL_T 58 and DL_B 60, and activating the WL signals 56 to store the charges in the data line pair DL_T 58 and DL_B 60 into the memory cells 52 and 54, respectively.

Figure 3:
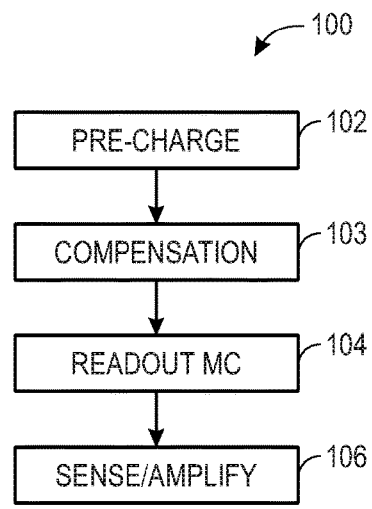
FIG. 3 is flow chart of a method for operation of an SA circuit with reversed bias compensation, in accordance with an embodiment.

During the read process, the WL signals may connect the memory cells 52 and/or 54 to data lines DL_T 58 and/or DL_B 60. The variation in the voltage of the data lines may be based on the relative capacitance of the memory cells and the data lines and may be relatively small (e.g., 10 mV, 100 mV, 200 mV for a memory device with 1.0V rail voltages). Therefore, in order to accurately read the stored data, the SA system 50 may include an amplifier 70 used to sense the minute voltages and to amplify its output to a higher voltage. The amplified voltage may be transferred to the local I/O lines LIOT 64 and LIOB 68. Additionally, a pre-charge and equalizer (PC) circuit 76 may be used to equalize the data-lines DL_T 58 and DL_B 60 prior to the read-out, to further facilitate the detection of variations in the data lines caused by memory cells 52 and/or 54. The flow chart of FIG. 3 illustrates a general method for performing a read-out using the amplifier 70 and the PC circuit 76. In a process block 102, the PC circuit 76 may be activated to equalize the data lines DL_T 58 and DL_B 60 and to set their voltages to a mid-voltage level (i.e., a voltage level that discriminates between a true and a false value in the memory cells 52 and 54). In some embodiments, the mid-voltage level may be around 0.4V.

Following the pre-charge, in a process block 103, biasing circuitry, which may be coupled to the PC circuit 76, may adjust the levels of the data lines DL_T 58 and DL_B 60 to compensate for electrical characteristic mismatches in the amplifier 70, as detailed below. The biasing circuitry may generate a reversed bias in transistors of the amplifier 70, which may generate a voltage difference between data lines DL_T 58 and DL_B 60 that may be proportional to differences in the threshold voltages. This difference may compensate for effects of the differences in the threshold voltages during the readout in process block 104. The compensation mechanism is detailed in the discussion of FIGS. 6A and 6B. Specific implementations of the biasing circuitry are detailed in FIGS. 4, 7, 8, and 9.

In a process block 104, the memory cells 52 and/or 54 may be coupled to the respective data lines DL_T 58 and DL_B 60. The variation in the signal caused by the stored data may be determined based on a ratio of the capacitance of memory cells 52 and 54 and the capacitance of data lines DL_T 58 and DL_B 60. As such, the variations caused during the readout may be in a range of 10 to 200 mV from the mid-level voltage, which may be in a range between 0.4-0.5V. As the data lines present a voltage difference generated in process block 103, the differences in the data lines DL_T 58 and DL_B 60 at the end of the readout of process block 104 may be more sensitive to the charges from memory cells 52 and/or 54.

In process block 106, the amplifier 70 may latch to a HIGH or a LOW level based on the difference between data lines DL_T 58 and DL_60 at the end of the readout in the process block 104. For example, if the DL_T 58 voltage is higher than the DL_B 60 voltage, the amplifier 70 may latch the data lines DL_T 58 and DL_B 60 to 1.0V and 0V respectively. In another example, if the DL_T 58 voltage is lower than the DL_B 60 voltage, the amplifier 70 may latch the data lines DL_T 58 and DL_B 60 to 0V and 1.0V, respectively. The latched and amplified signals may be transferred to the local I/O lines LIOT 64 and LIOB 68, as discussed above.

In order to perform the latching process described above, the amplifier 70 may receive voltages from common source lines CSP 72 and CSN 74, as illustrated in FIG. 2. Common source lines CSP 72 and CSN 74 may be coupled to a pre-charge and equalizer (PC) circuit 78. The PC circuit 78 may be used to prevent interference of the common source lines CSP 72 and CSN 74 in the sensing operation of the flip-flop during the read-out process, as further detailed below. Moreover, each common source line may be connected to a power line. CSP 72 may be coupled, via switch 90, to a positive power rail 92 and CSN 74 may be coupled, via switch 94 to a ground power rail 96. Switches 90 and 94 may be used to charge the common source lines CSP 72 and CSN 74 to the voltages used by the amplifier 70 during the latching process. As detailed below, switches 90 and/or 94 may also charge the common source lines CSP 72 and/or CSN 74 to intermediate voltages to reverse bias transistors in the amplifier and facilitate the compensation process in process block 103 of FIG. 3.

Figure 4:
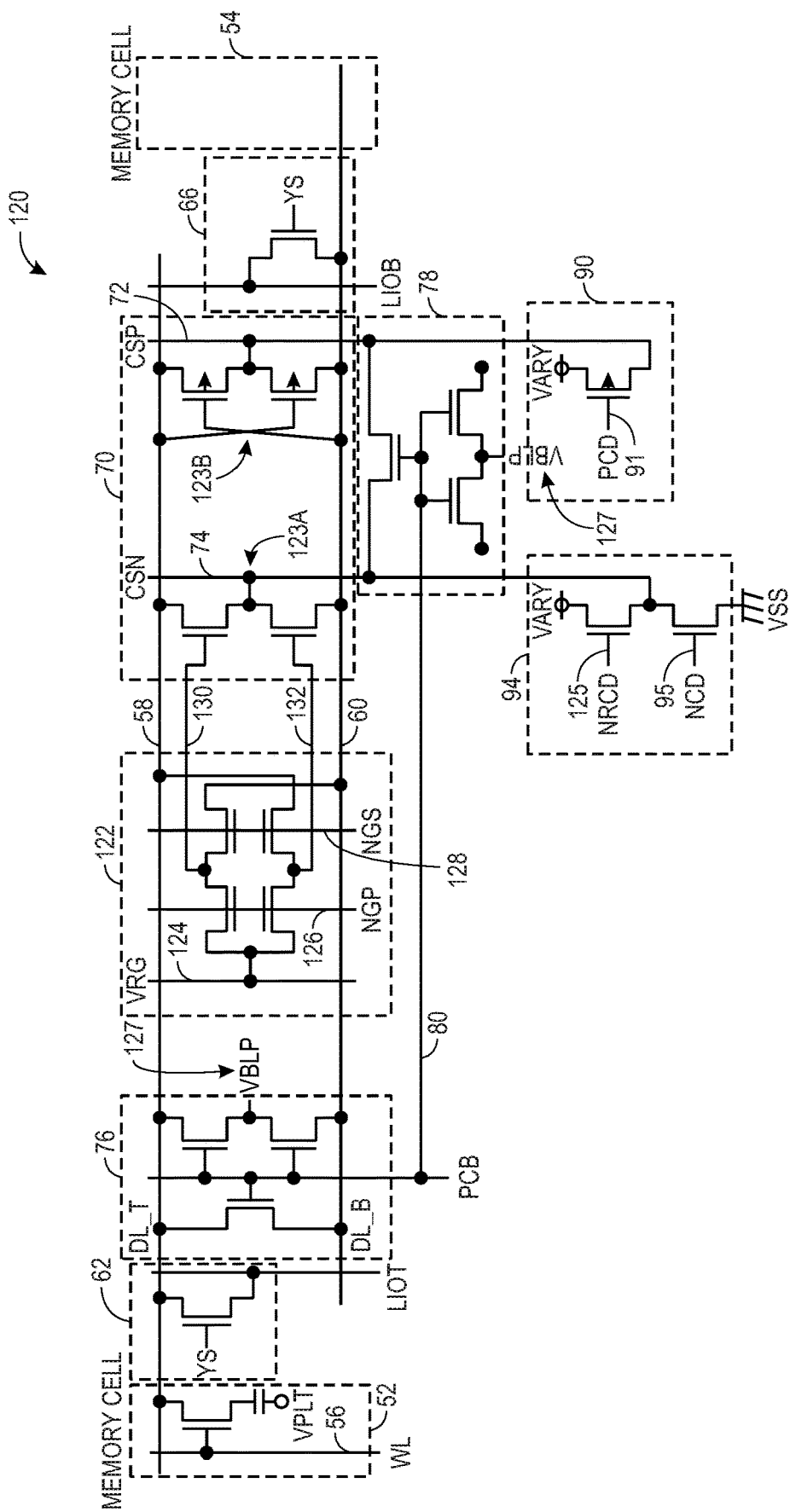
FIG. 4 is a an electrical implementation of an SA circuit with reversed bias compensation, in accordance with an embodiment.

With the foregoing in mind, FIG. 4 illustrates an electrical diagram for an implementation of an SA circuit 120. The functional blocks and data lines described in FIG. 2 may relate to circuits and electrical connections in the electrical diagram of FIG. 4 and are referred to using the same element numbers. In the SA circuit 120, the memory cell 52 may be implemented by a capacitor and an NMOS transistor with a gate coupled to WL signal 56. Memory cell 54 may be implemented using a similar circuit design. Switches 62 and 66 may be implemented by an NMOS transistor that couples a data line to the local I/O line and receives a YS signal at a gate. Specifically, switch 62 may couple the local I/O line LIOT 64 data line DL_T 58 and switch 66 may couple the local I/O line LIOB 68 to data line DL_B 60.

The amplifier 70 may be implemented by a flip-flop circuit constituted by two paired NMOS transistors 123A and two paired PMOS transistors 123B that are cross-coupled to data lines DL_T 58 and DL_B 60. In the SA circuit 120, the gates of the PMOS transistors 123B may couple to the data lines DL_T 58 and DL_B 60 in the cross-coupling configuration using a direct connection. In contrast, gates of the NMOS transistors 123A of the amplifier 70 may be coupled to the data lines DL_T 58 and DL_B 60 by a biasing circuit 122. The biasing circuit 122 may be formed by four NMOS transistors. The four NMOS transistors may connect the gates of the NMOS transistors 123A of the amplifier 70, either to the data lines DL_T 58 and DL_B 60, or to a source that provides a VRG voltage 124. The biasing circuit 122 may be configured by gate signals, such as the NGP signal 126 and the NGS signal 128. Specifically, when NGP signal 126 is HIGH and NGS signal 128 is LOW, the gates of the NMOS transistors 123A of the amplifier may be coupled to the VRG voltage 124. When NGP signal 126 is LOW and NGP signal 126 is HIGH, the gates of the NMOS transistors 123A may be coupled to the appropriate data lines in the cross-coupled configuration discussed above. The VRG voltage 124 may be used to reconnect the gate electrode of the NMOS transistors 123A of the amplifier 70 during the reversed bias compensation (e.g., process block 103 of FIG. 3).

Common source lines CSP 72 and CSN 74 may be charged as controlled by switches 90 and 94. Switch 90 may be implemented by a PMOS transistor that is controlled by a PCD signal 91 and may pull-up CSP 72 to HIGH (e.g., VARY voltage), to facilitate the amplification process. Switch 94 may be implemented by two NMOS transistors in a push-pull configuration controlled by NCD signal 95 and NRCD signal 125. The NCD signal 95 may be used to pull-down CSN 74 to LOW (e.g., VSS voltage or ground voltage), to facilitate the amplification process. The NRCD signal 125 may be used to provide a HIGH voltage to CSN 74 during the compensation period (e.g., process block 103 of FIG. 3), which may provide a reversed bias voltage to the NMOS transistors 123A and may prevent flip-flop undesired switching while the gates are disconnected.

The pre-charge circuits 76 and 78 in SA circuit 120 may both be implemented by three NMOS transistors. Both pre-charge circuits 76 and 78 may be controlled by a common PCB signal 80 that may be applied to the gate of the NMOS transistors, as illustrated. In each of the pre-charge circuits 76 and 78, one NMOS transistor may be used to equalize the data lines and two NMOS transistors may be used to pull the data lines to a pre-charge voltage, e.g., the VBLR voltage 127. The pre-charge voltage may be a voltage that is between (e.g., in a mid-point between) a HIGH voltage and a LOW voltage.

Figure 5:
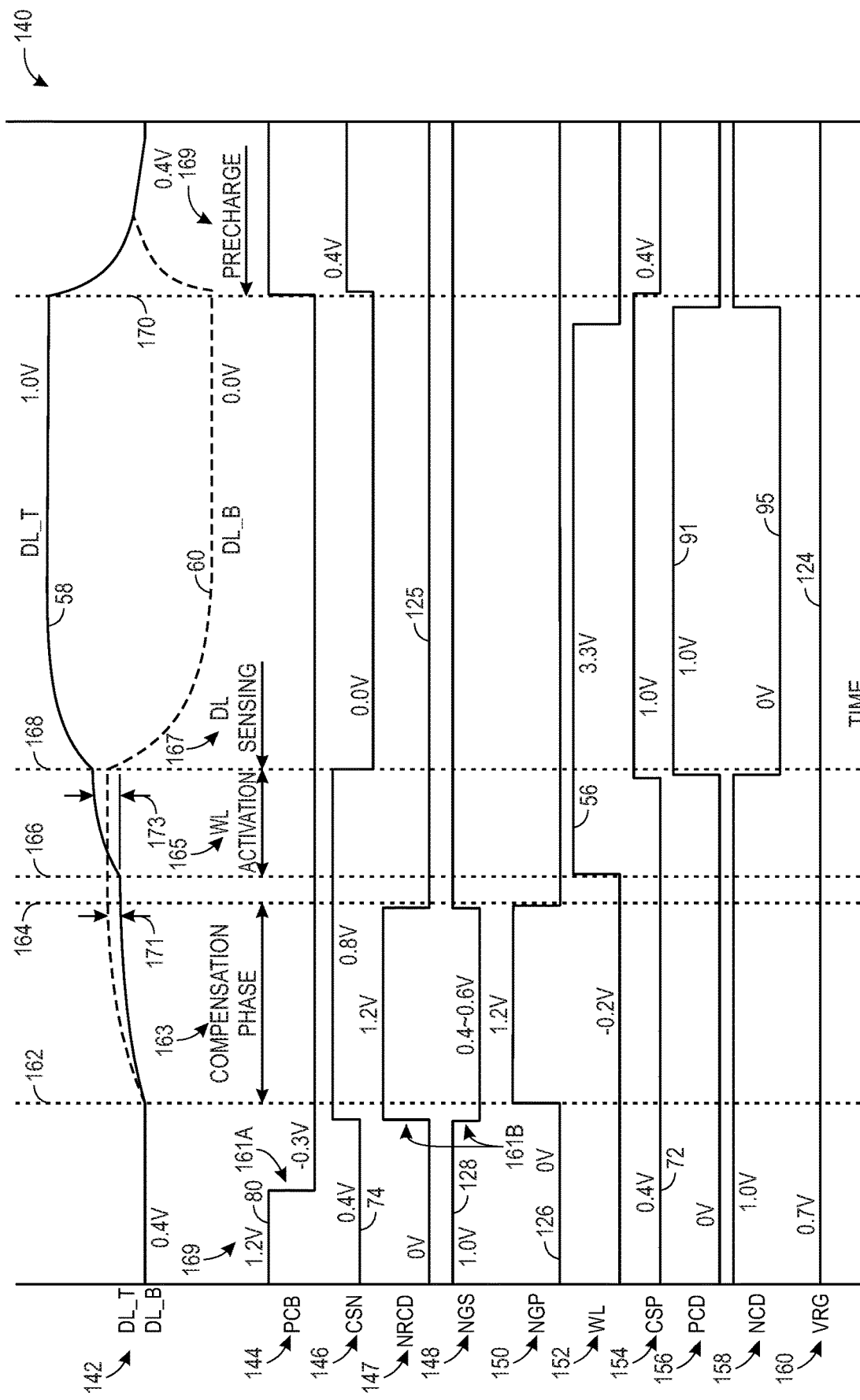
FIG. 5 is a chart illustrating operation waveforms for the SA circuit with reversed bias compensation of FIG. 4, in accordance with an embodiment.

The chart 140 in FIG. 5 illustrates the process discussed above for the SA circuit 120 of FIG. 4. The chart 140 includes subplots for the data lines 142, PCB 144, CSN 146, NRCD 147, NGS 148, NGP 150, WL 152, CSP 154, PCD 156, NCD 158, and VRG 160. Each curve is labeled in accordance with the signals indicated in the electrical diagram of FIG. 4. The chart may initiate in a pre-charge and equalization phase 169 (e.g., process block 102 of FIG. 3). During the pre-charge and equalization phase 169, PCB signal 80 may be HIGH to cause the PC circuits 76 and 78 to equalize and pre-charge the data lines DL_T 58 and DL_B 60 and the common source lines CSP 72 and CSN 74, respectively. The data lines and the common source lines may be pre-charged to the VBLR voltage 127, which is 0.4V in this example. Moreover, during the pre-charge and equalization phase 169, the NGS signal 128 may be set HIGH and NGP signal 126 may be set to LOW such that the gates of the NMOS transistors 123A in the amplifier are coupled to the data lines DL_T 58 and DL_B 60.

At time 161A, the PCB signal 80 may be set to LOW to switch off the PC circuits 76 and 78. In this example, the PCB signal 80 is set to a negative voltage. At time 161B the NRCD signal 125 may be set to HIGH, causing the CSN line 74 to be charged from the equalization voltage to a HIGH voltage. The increase in the CSN line 74 voltage may make the voltage higher than the voltage of data lines DL_T 58 and DL_T 60. As a result, the NMOS transistors 123A may be under a reverse bias, as the drain voltage (i.e., the CSN line 74) may be higher than the source voltage (i.e., the data lines). Simultaneously, or shortly after time 161B, the NGS signal 128 may be lowered from a HIGH voltage (e.g., 1.0V) to a lower voltage that is slightly above the pre-charge VBLR voltage 127. This voltage of the NGS signal 128 may be chosen to disconnect the gates of the NMOS transistors 123A of amplifier 70 from the data lines DL_T 58 and DL_B 60 and turn off the NMOS transistors 123A of amplifier 70 without lowering the gate signal to a substantially lower power rail level (e.g., VSS).

At time 162, to initiate the compensation phase 163, the NGP signal 126 may be raised from LOW to HIGH. As a result, the gates of the NMOS transistors 123A may be connected to the VRG voltage 124. During the compensation phase 163, the DL_T 58 and the DL_B 60 signals may raise to a value higher than the pre-charge VBLR voltage 127, as the NMOS transistors 123A are under a reverse bias. In effect, the voltages in DL_T 58 and DL_B 60 during the compensation phase may change due to the gate-source voltages of the NMOS transistors 123A. As the gate voltage is increased to the VRG voltage 124, the source voltages in the NMOS transistors 123 (e.g., voltages in DL_T 58 and DL_B 60) may also increase. The specific increase of each NMOS source is used to provide the compensating voltage, as detailed in FIGS. 6A and 6B below. The resulting increase in the data line signals may generate a voltage difference 171 between signals in DL_T 58 and DL_B 60. The voltage difference 171 may depend on the difference in the Vth voltages of the NMOS transistors 123A that are coupled to the data lines DL_T 58 and DL_B 60. The resulting voltage difference 171 may compensate for mismatches in the threshold voltage during the sensing phase, as detailed below in the discussion of FIGS. 6A and 6B.

At the end of the compensation phase, at time 164, NGP signals 126 and NGS signals 128 may be set to values that reconnect the gates of the NMOS transistors 123A to the data lines DL_T 58 and DL_B 60. At time 166, the WL signal 56 becomes HIGH, to initiate the readout period 165. The memory cells 52 and/or 54 may cause a change in the data lines DL_T 58 and/or DL_B 60, generating a read voltage difference 173 at the end of the readout period 165. At time 168, control signals, such as PCD signal 91 and NCD signal 95, may be used to charge the common source lines CSP 72 to HIGH and CSN 74 to LOW and latch the flip-flop based on the voltage difference 173. During this sensing phase 167, the charged common source signals may latch the flip-flop of amplifier 70 by driving the data lines DL_T 58 and DL_B 60 to the power source voltages (e.g., 0V and 1.0V) provided by the common source lines CSP 72 and CSN 74. In the example illustrated, the memory cell 52 may store a TRUE bit, causing the read voltage difference 173 to be positive and resulting in data lines DL_T 58 and DL_B 60 latching to 1.0V and 0V, respectively. It should be noted that the memory cell 52 may store a FALSE bit, which would cause a different read voltage difference at the end of the readout period 165 that would drive data lines DL_T 58 and DL_B 60 to 0V and 1.0V, respectively. At time 170, a new readout cycle may begin with a new pre-charge and equalization phase 169.

Figure 6A:
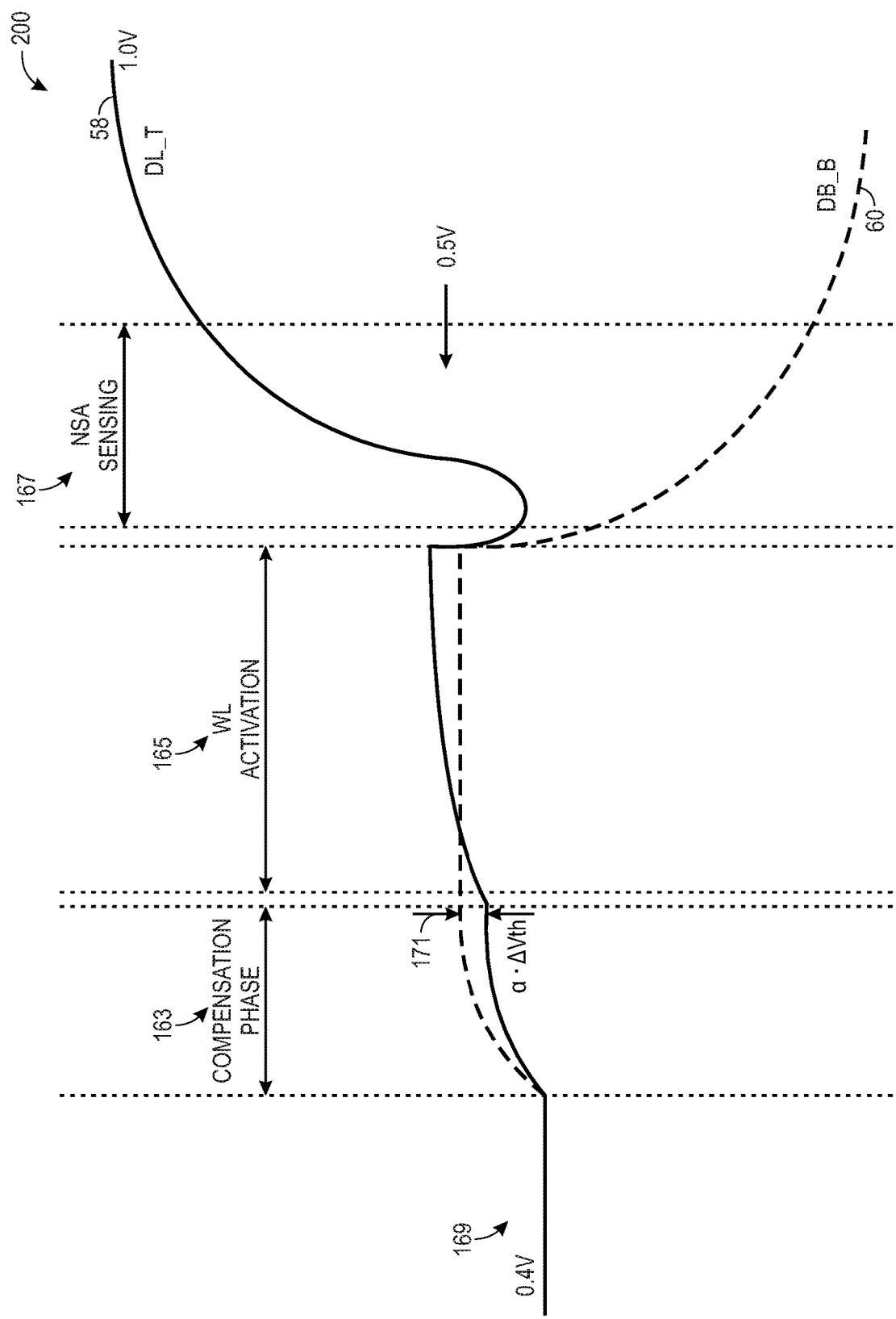
FIG. 6A is a chart illustrating the effect of the reversed bias compensation, in accordance with an embodiment.
Figure 6B:
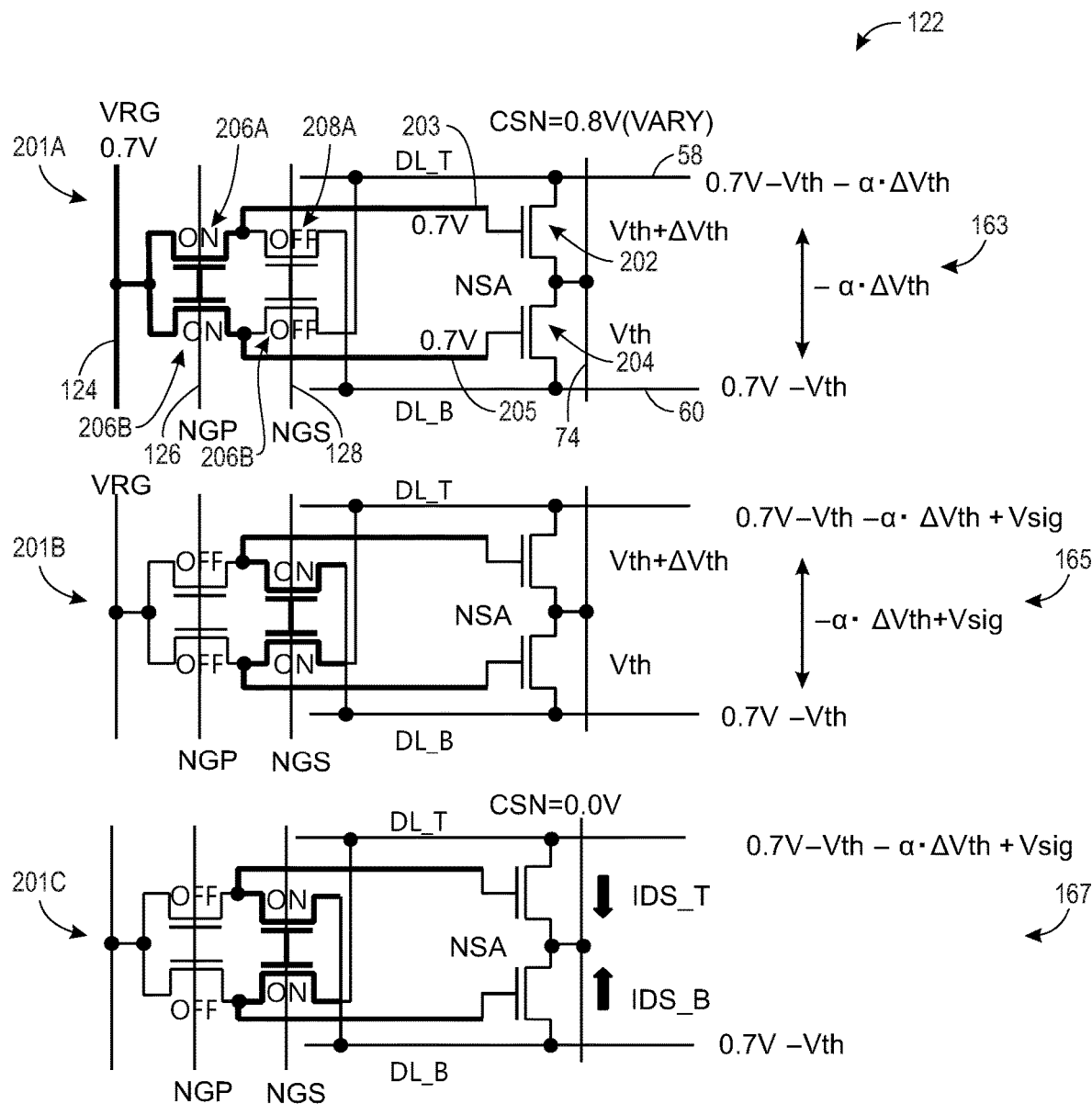
FIG. 6B is a schematic diagram illustrating the operation of pre-charge circuitry during the reversed bias compensation in SA systems with reversed bias compensation, in accordance with an embodiment.

Chart 200 of FIG. 6A and diagrams 201A, 201B, and 201C of FIG. 6B detail the gate-source threshold voltage (Vth) compensation mechanism employed by the biasing circuits (e.g., biasing circuit 122) of the SA circuits described herein. While chart 200 and diagrams 201A, 201B, and 201C indicate to specific voltage levels, those values are provided as illustrations of voltage levels that may be used in a particular embodiment. Memory devices that employ different voltage specifications may have different voltage levels for signals that perform similar functions. In such embodiments, the voltages that may be adjusted correctly, in light of the present disclosure.

As discussed above, the threshold voltage (i.e., the gate-source threshold voltage, Vth) of NMOS transistors may suffer variabilities during the manufacturing process. Accordingly, the NMOS transistors 202 and 204 in the amplifier 70 may have different gate-source threshold voltages, as shown in FIG. 6A. The transistors 202 and 207 may be the NMOS transistors 123A of amplifier 70 of FIG. 4. In the discussion below, assume that the NMOS transistor 202 has a threshold voltage of Vth+ΔVth and assume that the NMOS transistor 204 has a threshold voltage of Vth. As a result, the Vth difference between NMOS transistors 202 and 204 may be ΔVth. In embodiments in which the NMOS transistors dominate the latching activity of the flip-flop of amplifier 70, differences in the Vth of the NMOS transistors 202 and 204 may lead to reduction in the sensitivity of the SA circuit, as discussed above. In fact, in the illustrated example, if the changes in the data lines DL_T 58 and/or DL_B 60 caused by the charge stored in the memory cells 54 and 56 are similar to or smaller than ΔVth, operation of the SA circuit 120 may provide an incorrect memory readout. The embodiments described herein compensate the presence of a ΔVth by sensing the difference during a compensation phase 163. To that end, the biasing circuit 122 may cause sensing of the ΔVth, and may cause a difference between the data line signals DL_T 58 and DL_B 60 during the compensation phase 163 that may be proportional to the ΔVth.

Chart 200 of FIG. 6A illustrates the variations to data line DL_T 58 and DL_B 60 following the pre-charge and equalization phase 169. Variations during the compensation phase 163, associated with the diagram 201A of FIG. 6B, the readout period 165, associated with the diagram 201B, and the sensing phase 167, associated with diagram 201C, are illustrated. As discussed in the description of FIG. 5, at the beginning of compensation phase 163, the data line signals DL_T 58 and DL_B 60 may be at a pre-charge voltage (e.g., 0.4V) as set by the VBLR voltage 127.

As illustrated in diagram 201A of FIG. 6B, in the compensation phase 163, the NGP signal 126 and the NGS signal 128 may be driven voltages that cause the biasing circuit 122 to couple the gate lines 203 and 204 of transistors 202 and 204 to the VRG voltage 124. In the example, VRG signal 124 may be 0.7V. More generally, the VRG voltage 124 may be chosen to be sufficiently higher than the VBLR voltage 127. As a result, the two NMOS transistors 202 and 204 are turned on with a common gate voltage provided by the VRG voltage 124. It should be noted that, as discussed above, the CSN 74 is set to a higher voltage (e.g., 0.8V). In this configuration, at the beginning of the compensation period, the NMOS transistors 202 and 204 are under a reversed bias. As a result, the transistors 202 and 204 are operating in the saturation region and the voltages in the DL_T 58 and DL_B 60 may be driven to levels based on the gate-source threshold voltages and the gate voltage. Specifically, in this example, the voltage in the data line DL_B 60 may become 0.7V−Vth, in which the 0.7V component may correspond to the gate voltage (i.e., the VRG voltage 124). Due to the presence of the ΔVth, the DL_T signal 58 may become 0.7V−Vth−αΔVth. The α coefficient may correspond to a constant associated with the duration of the compensation phase 163, and may be a number between 0 and 1. As the duration of the compensation phase 163 increases, the coefficient α increases from 0 to 1. To obtain fast read cycle times, the compensation phase 163 duration may be chosen to be, for example, between 1 ns and 2 ns, and the coefficient α may, as a result, be in a range between 0.4 to 0.6. At the end of the compensation phase 163, the voltage difference 171 between the data lines DL_T 58 and DL_B 60 may be αΔVth.

During the readout period 165 illustrated in diagram 201B of FIG. 6B, the NGP signal 126 and the NGS signal 128 may be driven to voltages that cause the biasing circuit 122 to couple the gate lines 203 and 204 of transistors 202 and 204 to data lines DL_T 58 and DL_B 60, respectively. Moreover, the WL signal 56 may be raised to couple the memory cell 52 to the data lines DL_T 58. As a result, the signal in the data line DL_T 58 may raise by a value that. In this example, the DL_T 58 is assumed to change by voltage Vsig. That is, DL_T signal 58 may become 0.7V−Vth−αΔVth+Vsig at the end of the readout period 165.

Following the readout period 165, a sensing phase 167, illustrated in diagram 201C may begin. The common source CSN 74 becomes LOW so that the paired NMOS transistors 202 and 204 are turned ON state and within a saturated region. The drain currents IDS_T and IDS_B, which may be the currents in transistors 202 and 204, respectively, may be given as:

$IDS\_T=(½)β(VRG−2Vth−ΔVth)^2$ and $IDS\_B=(½)β(VRG−2Vth−αΔVth−Vsig)^2$, in which β is a transistor parameter common to NMOS transistors 202 and 204. From these expressions, we obtain the condition Vtrip=(1−α)ΔVth, which may be calculated by identifying the value for Vsig that make currents IDS_T and IDS_B to be the same. If the Vsig provided by a memory cell is higher than the trip point Vtrip, correct sensing may be obtained. It should be noted that if α=1 (that is, if the compensation phase 163 is long), Vtrip=0, which means that the SA circuit 120 may correctly identify any Vsig above 0V (e.g., as small as 100 mV, 10 mV, 1 mV).

Figure 7:
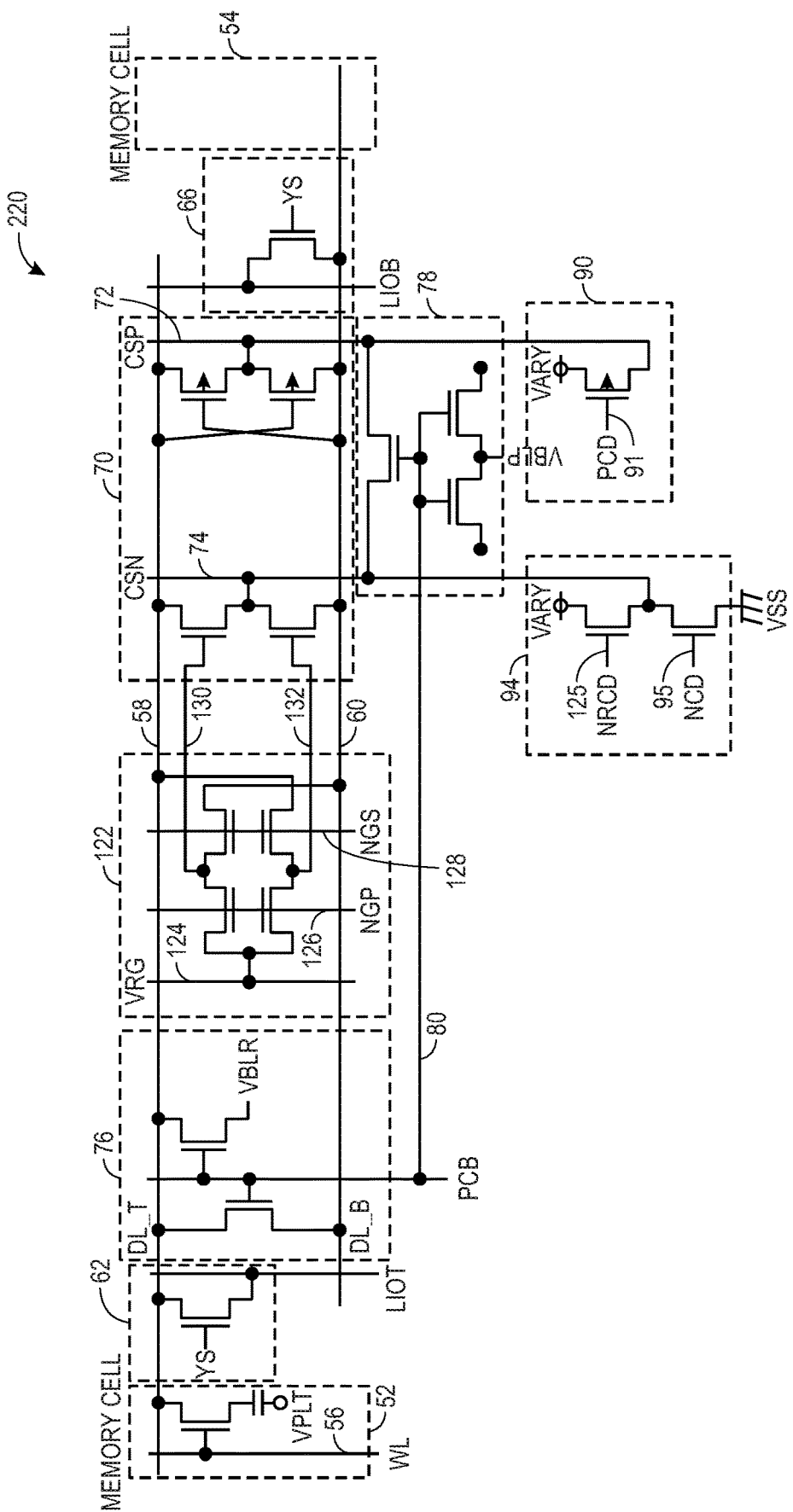
FIG. 7 is a second electrical implementation of an SA circuit with reversed bias compensation, in accordance with an embodiment.

FIG. 7 illustrates another embodiment for a SA circuit 220 with reversed bias compensation. The SA circuit 220 may have several components that are similar to the SA circuit 120 discussed in FIG. 4 and those components are referred to using a common element number. It should be noted that the SA circuit 220 also includes the biasing circuit 122 and the switch 94, which may be used to sense Vth differences using the reversed bias method discussed above, and adjust the data lines voltages during the compensation phase 163. In fact, the operation of the SA circuit 220 may be similar to the operation of the SA circuit 120, and may operate in accordance with the chart 200 of FIG. 4.

The SA circuit 220 may include a simpler pre-charge and equalizer (PC) circuit 276 that pre-charges and equalizes the data lines DL_T 58 and DL_B 60. In the PC circuit 76 of FIG. 4, three transistors are employed. By contrast, in the PC circuit, a transistor that couples the VBLR voltage 127 to the data line DL_B 60 is removed. By removing the extra transistor, the size of the SA circuit 220 may be decreased.

Figure 8:
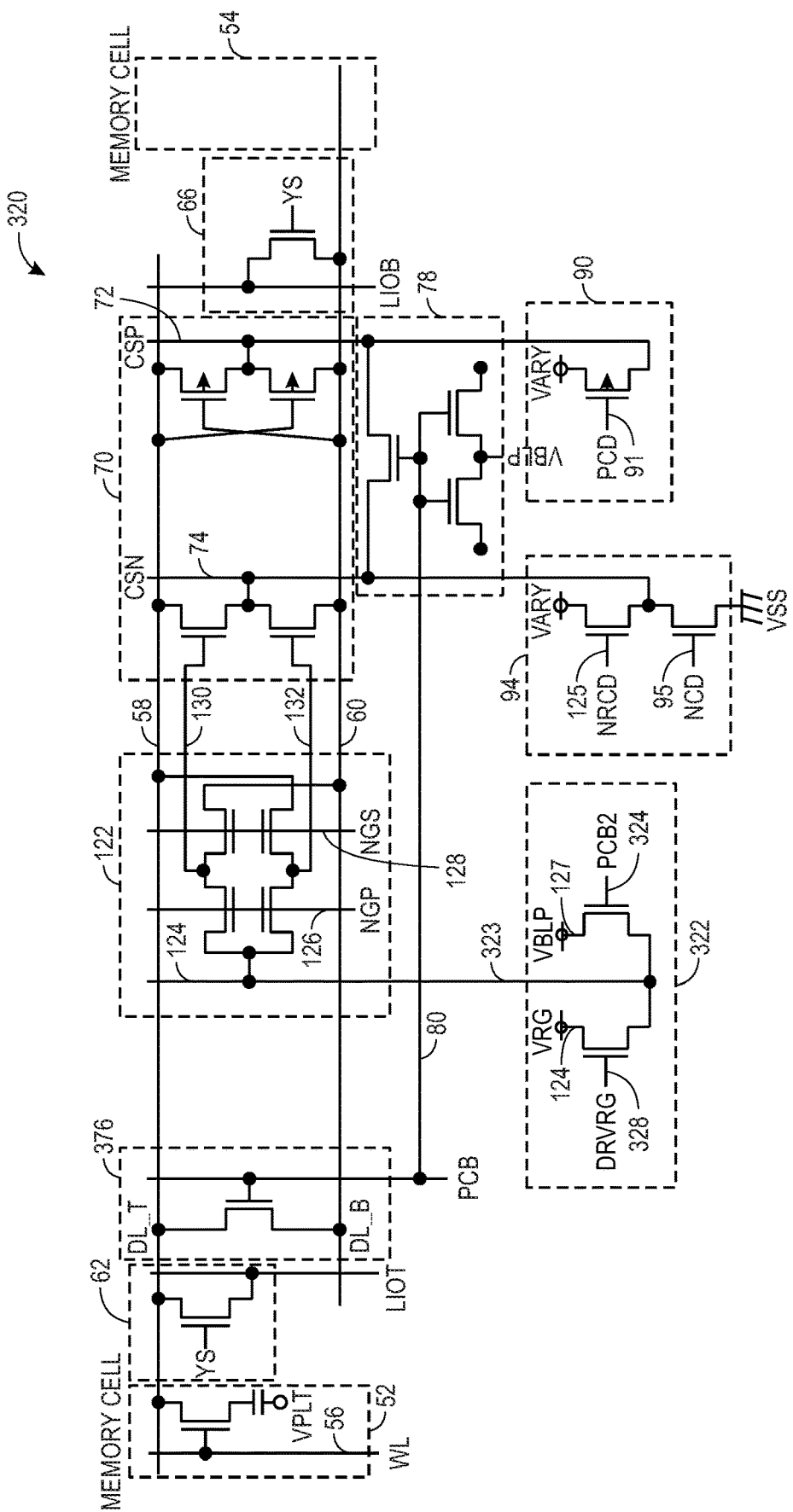
FIG. 8 is a third electrical implementation of an SA circuit with reversed bias compensation, in accordance with an embodiment.

The pre-charge and equalizer circuit may be further reduced, as illustrated in the SA circuit 320 with reversed bias compensation circuitry of FIG. 8. The SA circuit 320 may have several components that are similar to the SA circuit 120 discussed in FIG. 4 and those components may be referred to using the same element numbers. It should be noted that the SA circuit 320 also includes the biasing circuit 122 and the switch 94, which may be used to charge the adjust the data lines during the compensation phase 163, as discussed above. The SA circuit 320 also simplifies the dedicated pre-charge circuitry by providing an equalizing circuit 376 that includes a single transistor coupled to data line DL_T 58 to DL_T 60. In the SA circuit 320, the VBLR voltage 127 may be provided to the data lines DL_T 58 and DL_B 60 through the biasing circuit 122. To that end, the biasing circuit 122 may receive as a voltage 323, either the VRG voltage 124 or the VBLR voltage 127 from a switching circuitry 322. The switching circuitry 322 may receive as inputs a PCB2 signal 324 or a DRVRG signal 328 that may be used to select the voltage 323.

Figure 9:
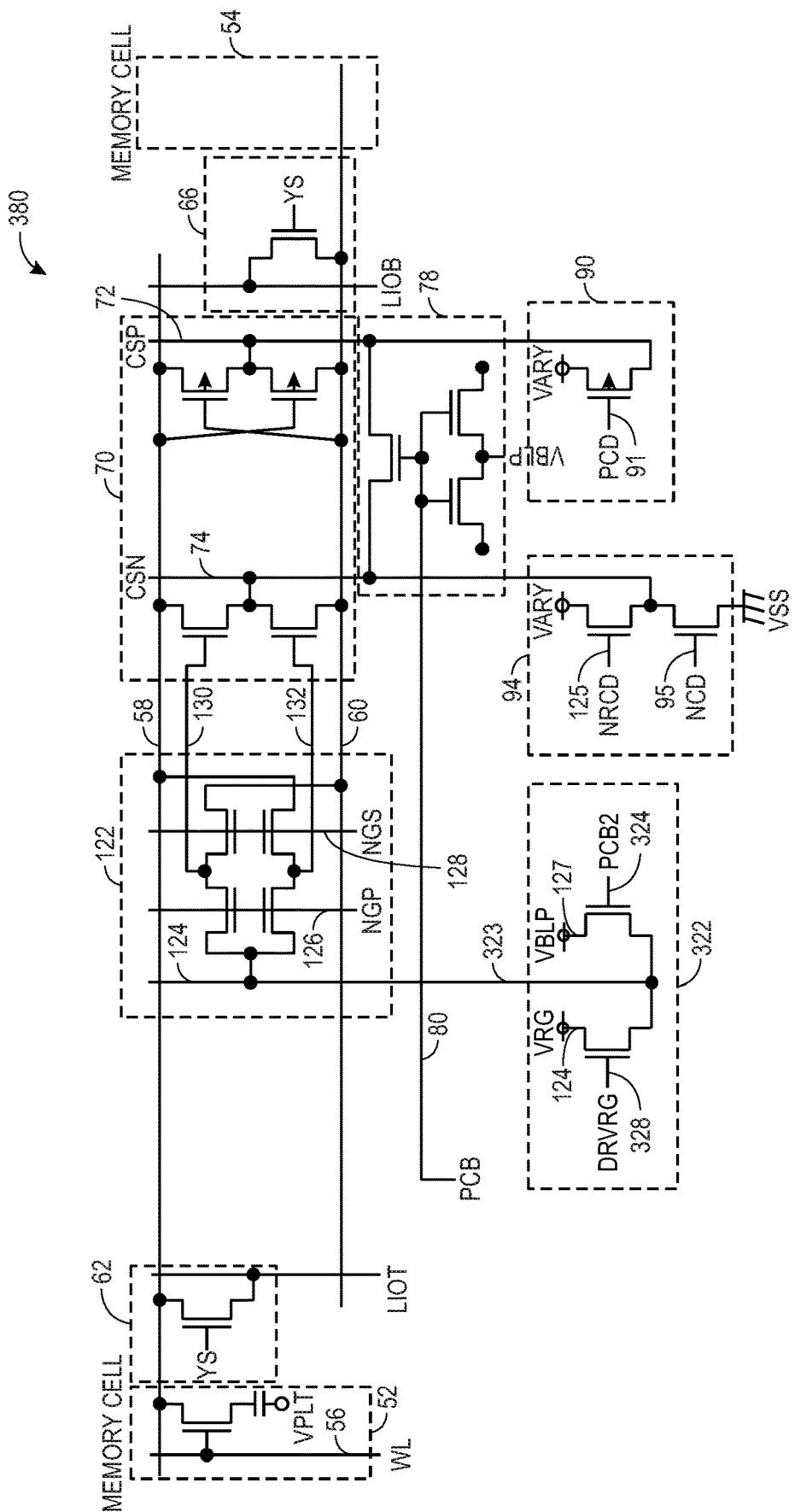
FIG. 9 is a fourth electrical implementation of an SA circuit with reversed bias compensation, in accordance with an embodiment.

The SA circuit 380 of FIG. 9 illustrates a further simplification of the dedicated pre-charge and equalizer circuitry of the data lines DL_T 58 and DL_B 60. The SA circuit 380 may have several components that are similar to the SA circuit 320 discussed in FIG. 8 and those components may be referred to using the same element numbers. However, as illustrated, the SA circuit 380 does not include any dedicated pre-charge or equalizer circuitry for data lines DL_T 58 and DL_B 60, such as the equalizer circuit 376 of FIG. 8. In the SA circuit 380, the pre-charge and equalization process may employ the biasing circuit 122 and the switching circuitry 322.

Figure 10:
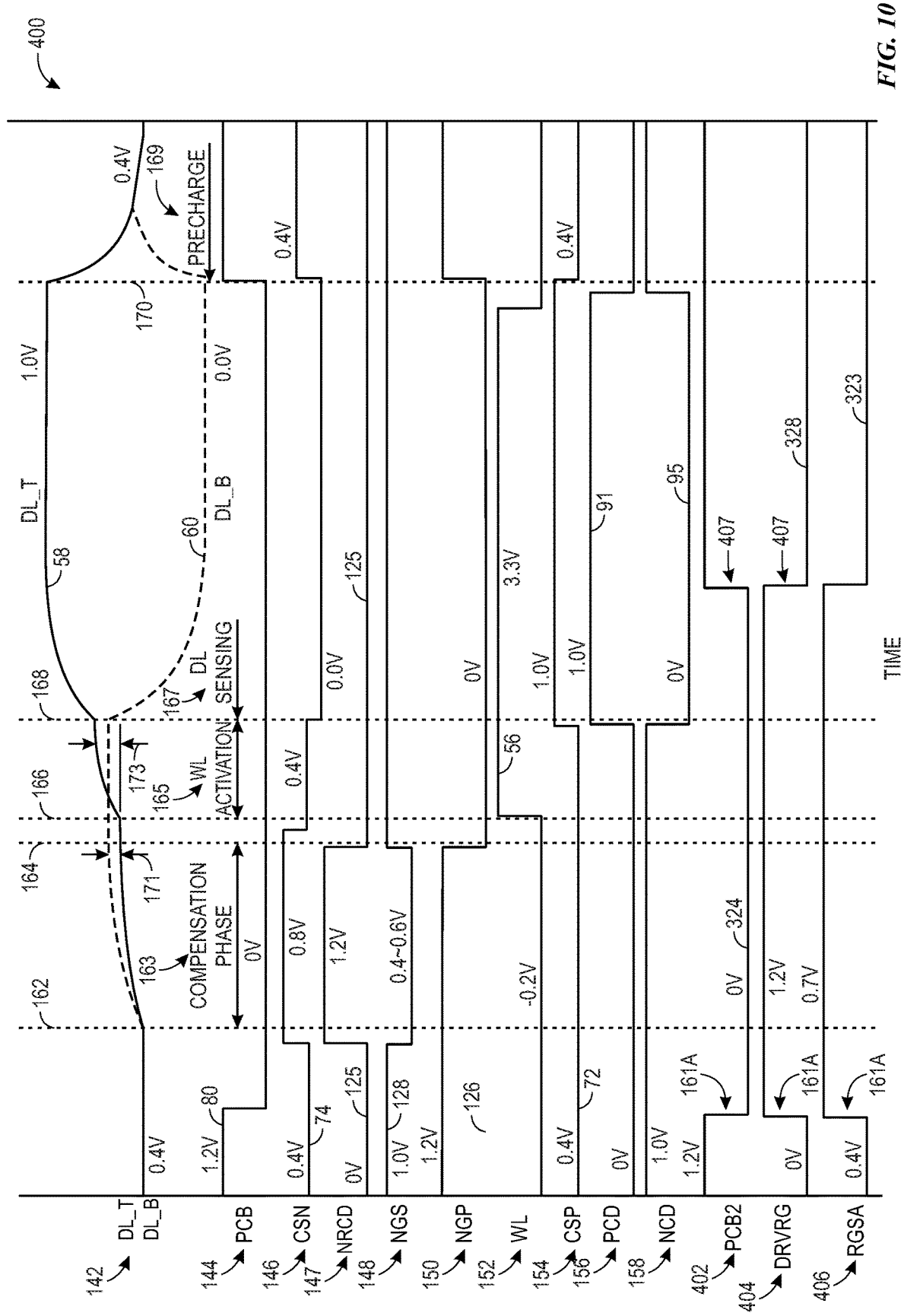
FIG. 10 is a chart illustrating operation waveforms for the SA circuit with reversed bias compensation of FIG. 9, in accordance with an embodiment.

The chart 400 in FIG. 10 illustrates the operation of SA circuits 320 of FIG. 8 and 380 of FIG. 9. The chart 400 includes subplots for the data lines 142, PCB 144, CSN 146, NRCD 147, NGS 148, NGP 150, WL 152, CSP 154, PCD 156, NCD 158, PCB2 402, DRVRG 404, and RGSA 406. Each curve is labeled in accordance to the signals indicated in the electrical diagram of FIGS. 8 and 9. As discussed above, the functionality of the SA circuits 320 and 380 may be substantially similar to that of SA circuit 120 of FIG. 4. Accordingly, chart 400 may have waveforms that are common to chart 140 of FIG. 4. The chart 400 also describes the operation of the switch circuitry 322. Along with the lowering of the PCB signal 80, at time 161A, the PCB2 signal 324 may also be lowered and the DRVRG signal 328 may be raised. As a result, the switch circuitry 322 may provide as output 323 the VRG voltage 124. Thus, the VRG voltage 124 is available to the biasing circuit 122 during the compensation phase 163 and may be used to disconnect the gates during the compensation phase 163 as discussed above. At a time 407, during the sensing phase 167, the PCB2 signal 324 may be raised and the DRVRG signal 328 may be lowered. As a result, the VBLR voltage 127 is available for the biasing circuit 122 to perform the pre-charging function in data lines DL_T 58 and DL_B 60.

Figure 11:
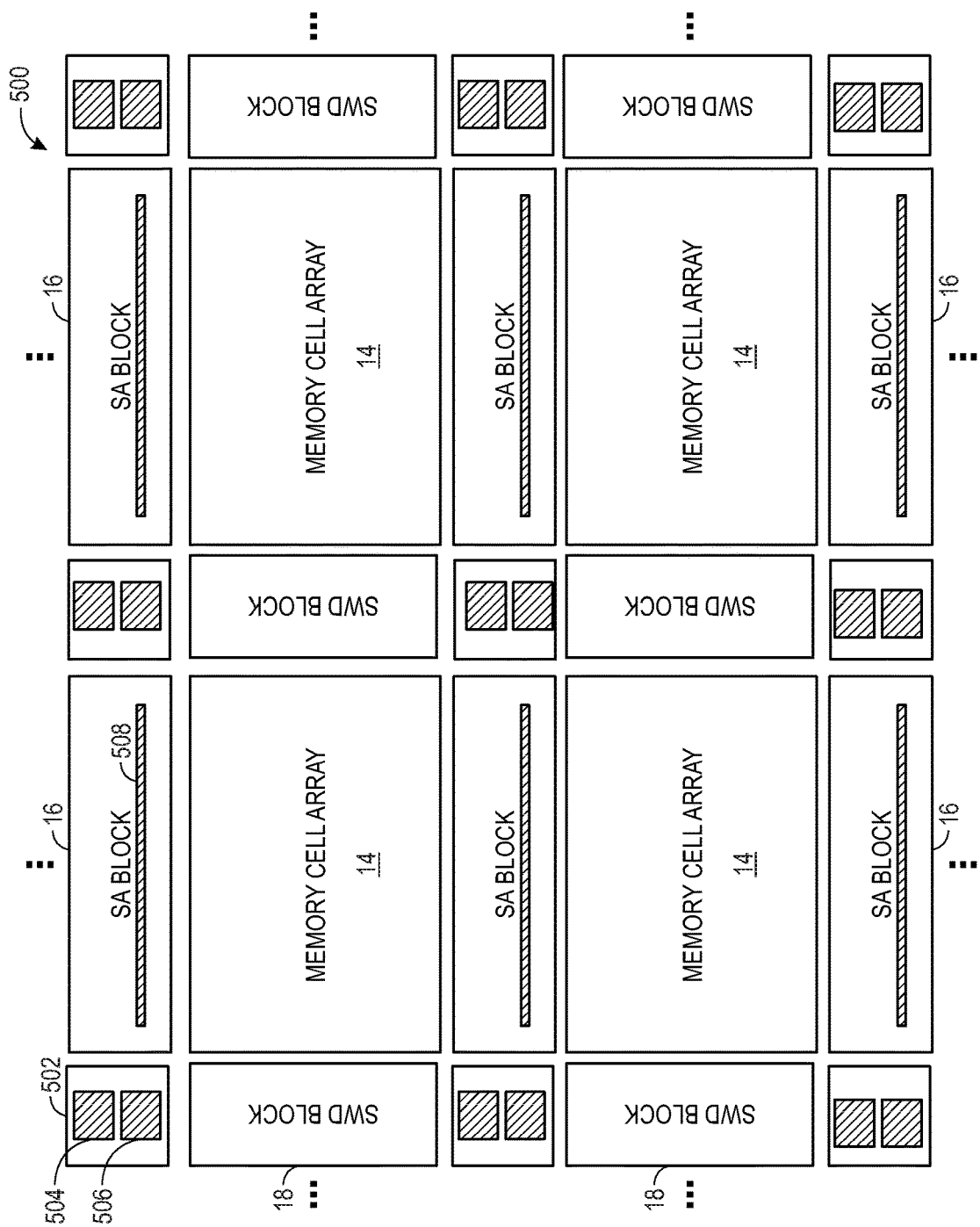
FIG. 11 is a diagram illustrating a disposition for components of the circuitry that forms the SA circuitry with reversed bias compensation, in accordance with an embodiment.

The block diagram 500 of FIG. 11 illustrates a potential disposition for circuitry of the SA systems discussed herein. Specifically, the block diagram 500 shows an example of layout positions within memory banks for circuits controlling the common source lines CSP 72 and CSN 74, such as PC circuit 78, and switches 90 and 94. In the arrangement, memory cell arrays 14 may be arranged near SA blocks 16 and SWD blocks 18, as discussed above. Moreover, the diagram illustrates circuitry blocks 502 that may be located at crossing points between the SA blocks 16 and SWD blocks 18. In the illustrated embodiment, the PC circuit 78 may be located in a block 504 within the circuit block 502. The switch 90 may be located in a block 506 within the circuit block 502. The switch 94 may be located in region 508 of the SA block 16. In some embodiments, the circuitry of switch 94 may be split between the region 508 of the SA block 16 and the block 504 within circuit block 502. For example, the pull-up transistor, having a gate coupled to the NRCD signal 125 may be placed in the block 504 and the pull-down transistor, having a gate coupled to NCD signal 95 may be placed in the region 508.

While the embodiments set forth in the present disclosure may be susceptible to various modifications and alternative forms, specific embodiments have been shown by way of example in the drawings and have been described in detail herein. However, it may be understood that the disclosure is not intended to be limited to the particular forms disclosed. The disclosure is to cover all modifications, equivalents, and alternatives falling within the spirit and scope of the disclosure as defined by the following appended claims.

What is claimed is:

1. An apparatus comprising:
   a flip-flop circuit comprising a first transistor and a second transistor; and
   a biasing circuit coupled to a first gate of the first transistor and a second gate of the second transistor, wherein the biasing circuit is configured to:
   couple the second gate of the second transistor to a first signal line and the first gate of the first transistor to a second signal line in a first configuration; and
   couple the first gate of the first transistor and the second gate of the second transistor to a first voltage line in a second configuration.

2. The apparatus of claim 1, wherein:
   the first transistor is coupled to a first common source line; and
   the second transistor is coupled the first common source line.

3. The apparatus of claim 2, wherein the biasing circuit comprises:
   a third transistor coupled between the second signal line and the first gate of the first transistor, wherein a third gate of the third transistor is coupled to a first control node;
   a fourth transistor coupled between the first signal line and the second gate of the second transistor, wherein a fourth gate of the fourth transistor is coupled to the first control node;
   a fifth transistor coupled between the first gate of the first transistor and the first voltage line, wherein a fifth gate of the fifth transistor is coupled to a second control node; and
   a sixth transistor coupled between the second gate of the second transistor and the first voltage line, wherein a sixth gate of the sixth transistor is coupled to the second control node.

4. The apparatus of claim 3, wherein the first and second control nodes are configured to control the third, fourth, fifth, and sixth transistors such that:
   the third transistor and the fourth transistor are rendered conductive in the first configuration; and
   the fifth transistor and the sixth transistor are rendered conductive in the second configuration during a compensation phase.

5. The apparatus of claim 4, comprising a switch that comprises a seventh transistor coupled between the first common source line and a first power supply line, wherein a voltage of the first power supply line is configured to reverse bias the first transistor and the second transistor during the compensation phase.

6. The apparatus of claim 2, comprising a third transistor coupled between the first common source line and a second power supply line.

7. The apparatus of claim 1, comprising pre-charge circuitry comprising a third transistor coupled between the first signal line and the second signal line.

8. The apparatus of claim 7, wherein the pre-charge circuitry comprises a fourth transistor coupled between the first signal line and a pre-charge voltage line.

9. The apparatus of claim 7, wherein the pre-charge circuitry comprises a fourth transistor coupled between the second signal line and a pre-charge voltage line.

10. The apparatus of claim 2, comprising a flip-flop circuitry comprising:
    the first transistor;
    the second transistor;
    a third transistor coupled between the first signal line and a second common source line, wherein a third gate of the third transistor is coupled to the second signal line; and
    a fourth transistor coupled between the second signal line and the second common source line, wherein a fourth gate of the fourth transistor is coupled to the first signal line.

11. The apparatus of claim 10, wherein the first and second transistors comprise an n-type metal-oxide semiconductor (NMOS) transistor, and the third and fourth transistors comprise a p-type metal-oxide semiconductor (PMOS) transistor.

12. The apparatus of claim 1, wherein the first signal line is coupled to a first plurality of memory cells and is configured to serve as a true bit line and wherein the second signal line is coupled to a second plurality of memory cells and is configured to serve as a complementary bit line.

13. A memory device, comprising:
    a sense amplify circuit coupled to a first plurality of memory cells through a first data line and coupled to a second plurality of memory cells through a second data line, wherein the sense amplify circuit comprises a biasing circuit and a flip-flop, wherein the flip-flop comprises:
    a first transistor coupled between the first data line and a first common source line; and
    a second transistor coupled between the second data line and the first common source line; and
    wherein the biasing circuit is configured to:
    couple the second data line to a first output of the biasing circuit and couple the first data line to a second output of the biasing circuit during a readout phase; and
    couple a first voltage line to the first output of the biasing circuit and couple the first voltage line to the second output of the biasing circuit during a compensation phase.

14. The memory device of claim 13, wherein the first common source line is configured to provide a first voltage during the compensation phase that is configured to reverse bias the first transistor and the second transistor.

15. The memory device of claim 13, wherein the first data line and the second data line are set to a pre-charge voltage prior to the compensation phase, and wherein the first voltage line comprises a first voltage sufficiently higher than the pre-charge voltage to turn on the first transistor and the second transistor during the compensation phase.

16. The memory device of claim 15, wherein the sense amplify circuit comprises a first pre-charge and equalizer circuitry that is configured to pre-charge the first and the second data line to the pre-charge voltage.

17. The memory device of claim 15, wherein the sense amplify circuit comprises a switching circuitry coupled to the first voltage line and configured to provide the pre-charge voltage prior to the compensation phase or the first voltage during the compensation phase.

18. A memory device comprising:
first and second data lines, wherein the first data line is coupled to a memory cell;
a first transistor comprising a first source terminal coupled to the first data line, a first gate terminal coupled to a first output of a biasing circuit and a first drain terminal coupled to a first common source line; and
a second transistor comprising a second source terminal coupled to the second data line, a second gate terminal coupled to a second output of the biasing circuit and a second drain terminal coupled to the first common source line; and
reversed bias compensation circuitry comprising the biasing circuit, a pre-charge circuitry, wherein the reversed bias compensation circuitry is configured to:
pre-charge and equalize the first data line and the second data line to a pre-charge voltage using the pre-charge circuitry; and
during a compensation phase, connect the first gate terminal and the second gate terminal to a first voltage higher than the pre-charge voltage using the biasing circuit; and
during a readout phase, connect the first gate terminal to the second data line and the second gate terminal to the first data line and connect the memory cell to the first data line.

19. The memory device of claim 18, wherein the compensation phase is configured to generate a first voltage difference between the first data line and the second data line that is proportional to a difference $\Delta Vth$ between a first gate-source threshold voltage of the first transistor and a second gate-source threshold voltage of the second transistor.

20. The memory device of claim 18, wherein the reversed bias compensation circuitry comprises a switch coupled to the first common source line, and wherein during the compensation phase, the switch is configured to provide a second voltage that reverse biases the first transistor and the second transistor.

21. The memory device of claim 19, wherein the compensation phase comprises a first duration configured to cause the first voltage difference is to become a product between a proportionality factor $\alpha$ and the difference $\Delta Vth$, and wherein the proportionality factor $\alpha$ is based, in part, on the first duration.

22. The memory device of claim 21, comprising a trip voltage (Vtrip) specification that is based on the proportionality factor $\alpha$, wherein the first transistor and the second transistor are configured to sense a voltage difference between the first data line and the second data line that is larger than the Vtrip specification.

* * * * *